United States Patent [19]

Ito et al.

[11] Patent Number: 5,614,350
[45] Date of Patent: Mar. 25, 1997

[54] PHOTOSENSITIVE TRANSFER MATERIAL AND METHOD OF IMAGE FORMATION USING THE SAME

[75] Inventors: Hideaki Ito; Masayuki Iwasaki, both of Shizuoka, Japan

[73] Assignee: Fuji Photo Film Co., Ltd., Kanagawa, Japan

[21] Appl. No.: 544,871

[22] Filed: Oct. 18, 1995

[30] Foreign Application Priority Data

Oct. 18, 1994 [JP] Japan .................................. 6-252417
Apr. 19, 1995 [JP] Japan .................................. 7-093590

[51] Int. Cl.$^6$ .................................................. G03C 11/12
[52] U.S. Cl. ........................ 430/257; 430/256; 430/258; 430/259; 430/260; 430/271.1; 430/273.1
[58] Field of Search .................................. 430/256, 257, 430/258, 259, 260, 271.1, 273.1

[56] References Cited

U.S. PATENT DOCUMENTS 4,614,521 9/1986 Niwa et al. ............................ 430/201
5,393,640 2/1995 Wakata et al. ........................ 430/259

*Primary Examiner*—Geraldine Letscher
*Attorney, Agent, or Firm*—Sughrue, Mion, Zinn, Macpeak & Seas

[57] ABSTRACT

A photosensitive transfer material comprising a temporary support and a colored photopolymer layer formed on the temporary support. The colored photopolymer layer contains at least one quinophthalone dye. Also, disclosed is a method of forming an image using the photosensitive transfer material, to thereby form a multicolor image having good chromaticity even when organic solvent-soluble dyes are used and, in addition, having excellent transmission and light- and heat resistance. A color filter exhibiting high contrast as a liquid crystal display can also be produced using the photosensitive transfer material.

11 Claims, No Drawings

PHOTOSENSITIVE TRANSFER MATERIAL AND METHOD OF IMAGE FORMATION USING THE SAME

FIELD OF THE INVENTION

The present invention relates to a photosensitive transfer material suitable for forming multicolor images on substrates to prepare color filter in liquid crystal color displays, other types of color display panels, color proofing sheet, and the like. This invention also concerns a method of forming images and, particularly, a method of preparing such color filters using the inventive photosensitive transfer material.

BACKGROUND OF THE INVENTION

Various kinds of colored images are formed on substrates. For example, color filter may be formed by providing each picture element with a colorant so as to selectively transmit each of the three primary colors, namely, red, green and blue. To provide such picture elements having colorants, techniques including dyeing, printing, electrodeposition and pigment dispersion have come into practical use.

The dyeing method is disadvantageous because it is complicated and expensive when carried out in a manufacturing environment. In this method, a photosensitive solution is applied to a substrate followed by treating with a certain dye (*Photopolymer Technology*, edited by Yamaoka and Nagamatsu, Nikkan Kogyo shinbun-sha, 1988, pp. 504–513). The printing method is troublesome with respect to surface evenness of layers comprising printed transparent coloring picture elements, correctness of printed pattern shapes, precision of fixing pattern positions, etc. The electrodeposition method is disadvantageous because it requires previous formation of an electrode on a transparent substrate. As a result, there is little freedom in arranging the picture elements.

The pigment dispersion method provides excellent manufacturing stability. The process of the pigment dispersion method consists of dispersing a pigment into a photopolymer, applying the dispersion thus prepared to the substrate, pattern exposing the photopolymer layer thus prepared to light, and developing to form a monocolor picture element pattern. Picture element patterns for a color filter containing a plurality of colors are formed on a substrate by repeating the process many times. However, the picture element pattern tends to reduce light transmission. This is because the pigment particles that are dispersed into the polymer as colorants scatter and absorb light. Furthermore, scattering and double refraction of light by the pigment particles cause the axes of polarization to rotate, thereby resulting in a reduced contrast ratio of liquid crystal displays (The 7th Colorific Optics Conference, 1990, 512 Color Display 10.4 "Color Filters for Size TFT-LCD", by Ueki, Ozeki, Fukunaga, and Yamanaka).

On the other hand, the pigments that can be used for this purpose are limited to some extent because of the characteristics thereof such as dispersion properties. Consequently, color correction must be carried out to obtain the desired chromaticity. As a simple method, it is common practice to simultaneously use a yellow or purple pigment for color correction. However, the use of a yellow pigment considerably increases the above-described light scattering and absorption.

A known method which has been proposed to solve the above-noted problem inherent in pigments is to use dyes in place of the pigments [JP-A-57-16407 (The term "JP-A" as used herein means as an "unexamined published Japanese patent application"), JP-A-61-94004, JP-A-61-15106, JP-A-63-129322 and JP-A-63-298304, and U.S. Pat. Nos. 4,818,075 and 4,877,697]. However, in general, dyes disadvantageously have less durability as compared to pigments. Despite this, JP-A-6-9891 describes that quinophthalone dyes are durable, and that a resin dissolved in an organic solvent together with the dyes is applied to a substrate to form a film. However, to prepare a multicolor image in a similar manner, the respective solutions containing different organic solvent-soluble dyes must be repeatedly applied to a substrate. This causes the dyes to ooze out of previously formed picture elements such that desired chromaticity is not obtained.

SUMMARY OF THE INVENTION

An object of the present invention is to provide materials for forming multicolor images having the desired chromaticity despite the use of the above-noted organic solvent-soluble dyes and a method of forming images employing these materials. Another object of this invention is to provide color filters having excellent transmission and resistance to light and heat, and in addition, exhibiting high contrast when used for liquid crystal displays.

The above objects of the present invention have been achieved by providing a photosensitive transfer material comprising a colored photopolymer layer containing at least one quinophthalone dye formed on a temporary support, and a method of forming images using the photosensitive transfer material. More particularly, the method comprises:

(i) providing a photosensitive transfer material comprising a temporary support and a colored photopolymer layer formed on said temporary support;

(ii) contacting said colored photopolymer layer of said photosensitive transfer material with a permanent support while heating to adhere the photopolymer layer to the permanent support, and peeling said temporary support from the photosensitive transfer material to transfer said colored photopolymer layer to the permanent support; and (iii) pattern exposing and developing said transferred colored photopolymer layer to form an image on the permanent support.

The present invention will be illustrated below in detail.

DETAILED DESCRIPTION OF THE INVENTION

The temporary support for the photosensitive transfer material of this invention is preferably formed of a flexible substance having good chemical and thermal stability, and also having a high degree of readiness such that the temporary support can be peeled from a colored photopolymer layer or from a thermoplastic resin layer formed on the temporary support as needed. Examples of such substances include thin sheets of TEFLON, polyethylene telephthalate, polycarbonate, polyethylene, polypropylene, and laminates prepared therefrom. To secure good peeling properties, the temporary support preferably is not subjected to surface treatment such as glow discharge or to undercoating with gelatin as well. The thickness of the temporary support suitably ranges from 5 to 300 µm, and preferably from 20 to 150 µm.

When a colored photopolymer layer is transferred from a photosensitive transfer material to an uneven substrate, the colored photopolymer layer often fails to conform to the uneven surface of the substrate. This results in imperfect transfer or incorporation of bubbles. In order to prevent these problems, a thermoplastic resin layer is preferably provided between the temporary support and the colored photopolymer layer to mitigate any unevenness of the substrate.

The thermoplastic resin layer preferably has a thickness of 6 μm or more. This is because a thermoplastic resin layer having a thickness of 5 μm or less does not effectively eliminate the adverse effects of substrate unevenness exceeding 1 μm. In view of development properties and productivity, the upper limit of the thickness is about 100 μm or less, and preferably about 50 μm or less.

Under some transfer conditions, thermoplastic resins may be forced out to stain the permanent support. To remove these stains, alkali-soluble thermoplastic resins are preferably employed. This is because the stains can be easily removed by later treatment.

Furthermore, the resins forming the thermoplastic resin layer preferably have a substantial softening point of 80° C. or lower according to a Vicat indentation test as described in JIS K-7206. At least one preferred alkali-soluble soluble thermoplastic resin having such a softening point is preferably selected for use in thermoplastic resin layer from saponified products from copolymers of ethylene with acrylate, saponified products from copolymers of styrene with acrylate or methacrylate, saponified products from copolymers of vinyltoluene with acrylate or methacrylate, and saponified products from copolymers of vinyl acetate with acrylate or methacrylate, such as polyacrylate, polymethacrylate, butyl acrylate, and butyl methacrylate. Furthermore, among organic high polymers having a softening point of about 80° C. or lower as described in *Handbook on Plastic Performance* (edited by Nippon Plastic Kogyo Renmei and Zennippon Plastic Seikei Kogyo Rengo-kai, Kogyo Chosa-Kai, 1968), those which dissolve in aqueous alkaline solutions can be employed. The softening point of organic high polymers having a softening point of 80° C. or higher can be decreased to 80° C. or lower by adding thereto various types of plasticizers miscible with the organic high polymers. To adjust adhesion of the organic high polymers to the temporary support, various types of polymers, supercooling substances, adhesion improvers or surfactants, or surface lubricants can be added thereto, as long as the substantial softening point does not exceed 80° C. Examples of useful plasticizers include polypropylene glycol, polyethylene glycol, dioctyl phthalate, diheptyl phthalate, dibutyl phthalate, tricresyl phosphate, cresyl diphenyl phosphate, and biphenyl diphenyl phosphate.

The aqueous alkaline solution for removing stain may be the same as or different from the alkaline developer for the colored photopolymer layer for use in this invention. Furthermore, in this invention, the aqueous alkaline solutions is a dilute aqueous solution of an alkaline substance, and the solution may contain a small amount of an organic solvent miscible with water. Examples of suitable alkaline substances include alkali metal hydroxides (for example, sodium hydroxide and potassium hydroxide), alkali metal carbonates (for example, sodium carbonate and potassium carbonate), alkali metal bicarbonates (for example, sodium hydrogen carbonate and potassium hydrogen carbonate), alkali metal silicates (for example, sodium silicate and potassium silicate), alkali metal metasilicates (for example, sodium metasilicate and potassium metasilicate), triethanolamine, diethanolamine, monoethanolamine, morpholine, tetraalkylammonium hydroxides (for example, tetramethylammonium hydroxide), and sodium phosphate. The concentration of the alkaline substances ranges from 0.01 to 30% by weight and the pH is preferably from 8 to 14.

Examples of suitable organic solvents miscible with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and N-methylpyrrolidine. The concentration of the organic solvent miscible with water ranges from 0.1 to 30% by weight. Known surfactants can further be added to the developer. The concentration thereof is preferably from 0.01 to 10% by weight.

An intermediate layer can also be formed between the thermoplastic resin layer and the colored photopolymer layer. Preferred intermediate layers are those which can be dispersed or dissolved in water or in aqueous alkali solutions and which exhibit low oxygen permeability. In this manner, the intermediate layer prevents the adverse effects of oxygen which inhibits photopolymerization of the photopolymerizable monomers. Known intermediate layers can be employed, and examples thereof include copolymers of polyvinyl ether with maleic anhydride, water-soluble salts of carboxyalkyl celluloses, water-soluble cellulose ethers, water-soluble salts of carboxyalkyl starch, polyvinyl alcohol, polyvinyl-pyrrolidone, various types of polyacrylamides, various types of water-soluble polyamides, water-soluble salts of polyacrylic acid, gelatin, ethylene oxide polymers, water-soluble salts of various types of starch and their analogues, copolymers of styrene with maleic acid, maleate resins, and combinations of two or more of the above substances as described in JP-A-46-2121 and JP-B-56-40824 (The term "JP-B" as used herein means an "examined Japanese patent publication"). A combination of polyvinyl alcohol with polyvinylpyrrolidone is particularly preferred. The saponification ratio of the polyvinyl alcohol is preferably 80% or more and the polyvinylpyrrolidone content is preferably from 1 to 75% by weight, more preferably from 1 to 60% by weight, and most preferably from 10 to 50% by weight, based on the solid components of the intermediate layer. A content of less than 1% by weight does not provide sufficient adhesion of the intermediate layer to the photopolymer layer, and a content exceeding 75% by weight reduces the oxygen barrier properties. The intermediate layer is very thin, and preferably has a thickness of from about 0.1 to 5 μm and particularly preferably from 0.5 to 2 μm. A thickness of less than about 0.1 μm does not provide a sufficient oxygen barrier, and a thickness exceeding about 5 μm requires too much time to develop or remove the intermediate layer.

The photopolymer layer preferably exhibits softening or adhesion at a temperature of 150° C. or lower and is preferably thermoplastic. Most of the layers formed of known photopolymerizable compositions offer these properties, and some of these layers can be further modified by adding thermoplastic binders or compatible plasticizers.

Useful materials for the photopolymer layer of the present invention include known photopolymers, for example, those described in U.S. Pat. No. 5,155,005. Examples thereof include negative type photopolymer compositions comprising a diazo resin and a binder, photopolymerizable compositions, photopolymer compositions comprising an azide compound and a binder, and cinnamic acid-type photopolymer compositions. Among these, the photopolymerizable compositions containing a photopolymerization initiator, a photopolymerizable monomer and a binder as essential components are particularly preferred.

Examples of the photopolymerization initiator include poly (vic-ketaldonyl) compounds as disclosed in U.S. Pat. No. 2,367,660, acyloin ether compound as described in U.S. Pat. No. 2,448,828, aromatic acyloin compounds substituted with a α-hydrocarbon as described in U.S. Pat. No. 2,272,512, polynuclear quinone compounds as described in U.S. Pat. Nos. 3,046,127 and 2,951,758, the combination of triarylimidazole dimer and p-aminoketone as described in U.S. Pat. No. 3,549,367, benzothiazole compounds and trihalomethyl-s-triazine compounds as described in JP-B-51-48516, trihalomethyl-s-triazine compounds as described in U.S. Pat. No. 4,238,850, trihalomethyloxadiazole compounds as described in U.S. Pat. No. 4,212,976. Of these, trihalomethyl-s-triazine compounds, trihalomethyloxadiazole compounds, triarylimidazole dimer are preferred.

The photopolymerizable composition generally contains the photopolymerization initiator in an amount of from 0.5 to 20% by weight, preferably from 2 to 15% by weight, based on the total weight of the photopolymerizable composition. When the content is less than 0.5% by weight, it gives insufficient sensitivity to light and reduced strength of the resulting image. On the contrary, the content exceeding 20% by weight does not give no further effect in properties.

The photopolymerizable monomer preferably includes those having an addition-polymerizable and ethylenically unsaturated group in the molecule thereof and having a boiling point of not less than 100° C under a normal pressure. Examples thereof include monofunctional acrylates and methacrylates such as polyethylene glycol mono(meth)acrylate, poly (propylene glycol) mono(meth)acrylate, phenoxyethyl(meth)acrylate; polyfunctional acrylates and methacrylates such as polyethylene glycol di(meth)acrylate, polypropylene glycol di(meth)acrylate, trimethylolethane triacrylate, trimethylolpropane triacrylate, trimethylolpropane diacrylate, neopentyl glycol di(meth)acrylate, pentaerythritol tetra(meth)acrylate, pentaerythritol tri(meth)acrylate, dipentaerythritol hexa(meth)acrylate, dipentaerythritol penta(meth)acrylate, hexanediol di(meth)acrylate, trimethylolpropane tri(acryloyloxypropyl)ether, tri(acryloyloxyethyl) isocyanurate, tri(acryloyloxyethyl)cyanurate, glycerol tri(meth)acrylate, compounds obtained by addition reaction of polyfunctional alcohol such as trimethylolpropane, glycerol, etc. with ethyleneoxide or propyleneoxide followed by (meth)acrylation, urethane acrylates as described in JP-B-48-41708, JP-B-50-6034 and JP-A-51-37193, polyester acrylates as described in JP-A-48-64183, JP-B-49-43191 and JP-B-52-30490, epoxy acrylates which are reaction products of an epoxy resin with a (meth)acrylic acid. Of these, trimethylolpropane tri(meth)acrylate, pentaerythritol tetra(meth)acrylate, dipentaerythritol hexa(meth)acrylate, dipentaerythritol penta(meth)acrylate are preferred.

The photopolymerizable composition generally contains the photopolymerizable monomer in an amount of from 5 to 50% by weight, preferably from 10 to 40% by weight, based on the total weight of the photopolymerizable composition. When the content is less than 5% by weight, it gives insufficient sensitivity to light and reduced strength of the resulting image. On the contrary, when the content exceeds 50% by weight, adhesion of the photopolymer layer undesirably increased.

The binder for use in the photopolymerizable composition includes linear high molecular compounds compatible with the addition-polymerizable and ethylenically unsaturated monomer. Furthermore, those soluble to an organic solvent, and soluble or at least capable to swell to an alkalescent solution are preferred. Examples of such a compound include polymers having a carboxyl group in the side chain thereof, such as methacrylic acid copolymers, acrylic acid copolymers, itaconic acid copolymers, crotonic acid copolymers, maleic acid copolymers, partially esterified maleic acid copolymers, (these polymers are described, for example, in JP-A-59-44615, JP-B-54-34327, JP-B-58-12577, JP-B-54-25957, JP-A-59-53836, JP-A-59-71048, JP-A-1-152449, JP-A-2-199403 and JP-A-2-199404), and cellulose derivatives having a carboxyl group in the side chain thereof. In addition to the above described polymers, polymers having a cyclic acid anhydride or a hydroxyl group in the side chain thereof are also useful. Furthermore, adducts of a polymer having a hydroxyl group in the side chain thereof with a cyclic acid anhydride are useful. Of these, copolymers of a benzyl(meth)acrylate with a (meth)acrylic acid, and terpolymers of a benzyl(meth)acrylate, a (meth)acrylic acid and another monomer as described in U.S. Pat. No. 4,139,391 are particularly preferred. Although water-insoluble binders are exemplified above, water-soluble binders include poly (vinylpyrrolidone), poly(ethyleneoxide) and poly (vinyl alcohol).

Further, an alkali-insoluble polymer may be added to the binder for improving various properties such as strength of the cured film as long as it does not give an adverse effect in developability. Examples of the alkali-insoluble polymer include alcohol-soluble nylons and epoxy resins.

The photopolymerizable composition generally contains the binder in an amount of from 50 to 95% by weight, preferably from 60 to 90% by weight, based on the total weight of the photopolymerizable composition. When the content is less than 50% by weight, adhesion of the resulting photopolymer layer is undesirably enhanced. On the contrary, when the content exceeds 95% by weight, it gives insufficient sensitivity to light and reduced strength of the resulting image.

In addition to the above described components, a thermal polymerization inhibitor is preferably added to the photopolymer layer. Examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole, phenothiazine.

The thickness of the photopolymer layer is generally from 0.5 to 55 μm, preferably from 1 to 3 μm.

There are known photopolymers which can be developed with aqueous alkaline solutions or with organic solvents. However, in view of environmental considerations and hygienic safety, preferred photopolymers are those which can be developed with aqueous alkaline solutions.

The alkaline developers for developing the photopolymer layer in the present invention are dilute aqueous solutions of alkaline substances. Useful alkaline substances include the above described alkaline compounds, and the above-described organic solvents miscible with water can also be added to the alkaline developer solutions. The concentration of the alkaline substances ranges from 0.01 to 30% by weight and the pH is preferably from 8 to 14. Furthermore, known surfactants can also be added to the alkaline solutions, and the concentration of the surfactants preferably ranges from 0.01 to 10% by weight. The developers can be employed in a developing bath or as a spraying liquid. The removal of uncured portions in the photopolymer layer may be carried out by a combination of techniques, such as by rubbing the layer in a developer with a rotating brush, rubbing with a wet sponge, etc. The preferred developer temperature usually ranges from about room temperature to 40° C. A water-washing step can be added after the development treatment.

Quinophthalone dyes added to the photopolymer layer are preferably quinophthalone compounds and tautomers thereof represented by general formula (1) or (2). The compounds represented by general formula (2) are particularly preferred.

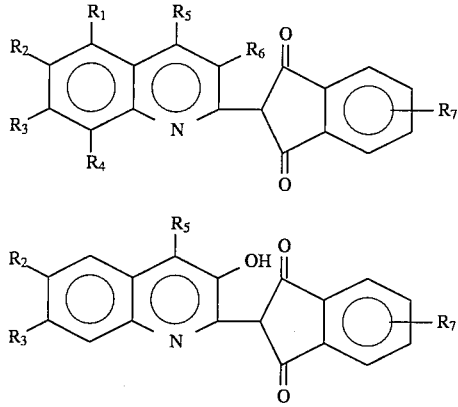

wherein $R_1$, $R_2$, $R_3$, $R_4$, and $R_5$ each represents a substituted or unsubstituted alkyl group having from 1 to 20 carbon atoms, a cycloalkyl group generally having from 4 to 20 carbon atoms, an aralkyl group generally having from 7 to 20 carbon atoms, an aryl group generally having from 6 to 20 carbon atoms, a halogen atom, or a hydrogen atom; $R_6$ represents a hydrogen atom or a hydroxyl group; $R_7$ represents a hydrogen atom, a halogen atom, an alkoxy group generally having from 1 to 20 carbon atoms, an amino group, an acyl group generally having from 2 to 20 carbon atoms, an acylamino group generally having from 2 to 20 carbon atoms, an alkoxycarbonyl group generally having from 2 to 20 carbon atoms, a carbamoyl group generally having from 1 to 20 carbon atoms, a substituted or unsubstituted alkyl group having from 1 to 20 carbon atoms, a cycloalkyl group generally having from 4 to 20 carbon atoms, an aralkyl group generally having from 7 to 20 carbon atoms, or an aryl group generally having from 6 to 20 carbon atoms.

The halogen atom represented by $R_1$ to $R_5$ and $R_7$ is a chlorine, fluorine, bromine or iodine atom. The alkoxy group represented by $R_7$ includes methoxy, ethoxy, propoxy, isopropoxy, butoxy and octadecyloxy groups. The amino group represented by $R_7$ includes ethylamino, diethylamino, dimethylamino, methylamino, butylamino, benzylamino and anilino groups. The acyl group represented by $R_7$ includes acetyl, propionyl and benzoyl groups. The acylamino group represented by $R_7$ includes acetyl-amino, N-methyl-acetylamino and benzoylamino groups. The alkoxycarbonyl groups represented by $R_7$ includes methoxycarbonyl, ethoxycarbonyl and benzyloxycarbonyl groups. The carbamoyl group represented by $R_7$ includes —$CONH_2$, —$CONHCH_3$, —$CONHC_2H_5$, —$CONHCH_2C_6H_5$, —$CON(CH_3)_2$, —$CON(C_4H_9$—n$)_2$, —$CONHC_2H_4N(CH_3)_2$ and —$CONHC_2H_4N(C_3H_7)_2$. The unsubstituted alkyl group represented by $R_1$ to $R_5$ and $R_7$ having from 1 to 20 carbon atoms includes straight-chain or branched chain hydrocarbons, such as methyl, ethyl, n-propyl, isopropyl, n-butyl, isobutyl, sec-butyl, t-butyl, n-pentyl, isopentyl, neopentyl, 1,2-dimethylpropyl, n-hexyl, cyclohexyl, 1,3-dimethylbutyl, 1-isopropylpropyl, 1,2-dimethylbutyl, n-heptyl, 1,4-dimethylpentyl, 2-methyl-1-isopropylpropyl, 1-ethyl-3-methylbutyl, n-octyl, 2-ethylhexyl, 3-methyl-1-isopropyl-butyl, 2-methyl-1-isopropyl-butyl, 1-t-butyl-2-methylpropyl and n-nonyl groups. The substituted alkyl group includes alkoxyalkyl groups such as methoxy-methyl, methoxyethyl, ethoxyethyl, propoxyethyl, butoxyethyl, γ-methoxypropyl, γ-ethoxypropyl, methoxyethoxyethyl, ethoxy-ethoxyethyl, dimethoxymethyl, diethoxymethyl, dimethoxyethyl and diethoxyethyl groups; halogenated alkyl groups such as chloromethyl, 2,2,2-trichloroethyl, trifluoromethyl and 1,1,1,3,3,3-hexafluoro-2-propyl groups; hydroxyalkyl groups such as hydroxymethyl, hydroxyethyl and hydroxypropyl groups; aminoalkyl groups such as N,N-dimethylaminoethyl, N,N-diethylaminoethyl and N,N-diethylaminopropyl groups; and aminoalkoxyalkyl groups such as N,N-dimethylaminoethoxyethyl, N,N-diethylaminoethoxyethyl and N,N-dipropylaminopropoxypropyl groups. The cycloalkyl group represented by $R_1$ to $R_5$ and $R_7$ includes cyclopentyl and cyclohexyl groups. The aralkyl group represented by $R_1$ to $R_5$ and $R_7$ includes benzyl and phenetyl groups. The aryl group represented by $R_1$ to $R_5$ and $R_7$ includes phenyl, tolyl, and p-methoxyphenyl groups.

Examples of particularly preferred quinophthalone include 2-(3-hydroxy-6-isopropyl-2-quinolyl)-1,3-dioxo1 H-indenecarboxylic acid N,N-dibutylamide, 2-(3-hydroxy-6-isopropyl-2-quinolyl)-1,3-dioxo-1H-indenecarboxylic acid N(2-N,N-dimethylaminoethyl)amide, 2-(3-hydroxy-6-isopropyl-2-quinolyl)-1,3-dioxo-1H-indenecarboxylic acid N-(2-N,N-dipropylaminoethyl)amide and 2-(3-hydroxy-4-bromo-6-isopropyl-2-qunolyl)-1,3-dioxo-1H-indenecarboxylic acid N,N-dibutylamide.

The photopolymer layer generally contains a quinophthalone dye in an amount of from 1 to 50% by weight, preferably from 5 to 30% by weight, based on the solids content of the photopolymer layer.

All pigments used as colorants, which must be uniformly dispersed in the photopolymer resin, preferably have a diameter of 5 μm or less, and particularly preferably 1 μm or less. For preparation of color filters, the pigments preferably have a diameter of 0.5 μm or less. Preferred dyes or pigments except yellow pigments are as follows: Victoria Pure Blue BO (C. I. 42595), Auramine (C. I. 41000), Fat Black HB (C. I. 26150), Permanent Carmine FBB (C. I. Pigment Red 146), Hostaperm Red ESB (C. I. Pigment Violet 19), Permanent Ruby FBH (C. I. Pigment Red 11), Fastel Pink B Spra (C. I. Pigment Red 81), Monastral Fast Blue (C. I. Pigment Blue 15), Monolite Fast Black B (C. I. Pigment Black 1) and carbon. Furthermore, examples of pigments suitable for forming color filters include C. I. Pigment Red 97, C. I. Pigment Red 122, C. I. Pigment Red 149, C. I. Pigment Red 168, C. I. Pigment Red 177, C. I. Pigment Red 180, C. I. Pigment Red 192, C. I. Pigment Red 215, C. I. Pigment Green 7, C. I. Pigment Green 36, C. I. Pigment Blue 15:1, C. I. Pigment Blue 15:4, C. I. Pigment Blue 15:6, C. I. Pigment Blue 22, C. I. Pigment Blue 60, and C. I. Pigment Blue 64.

The amount of a pigment and a dye including a quinophthalone dye contained in the photopolymer layer is generally from 5 to 70% by weight, preferably from 10 to 50% by weight, based on the solids content of the photopolymer layer.

To protect the colored photopolymer layer from adhesion of dirt and damage on storage, a thin covering sheet is preferably formed on the photopolymer layer. Although the covering sheet may be formed of the same or similar materials as those used for the temporary support, the sheet must be easily removed from the photopolymer layer. Examples of materials suitable for the covering sheet include silicone paper and polyolefin and polytetrafluoroethylene sheets. The thickness of the covering sheet is preferably from about 5 to 100 μm. Polyethylene and polypropylene films having a thickness of 10 to 30 μm are particularly preferred.

To prepare the photosensitive transfer material of the present invention, a colored photopolymer layer is formed on a temporary support by applying thereto a solution of materials for forming the colored photopolymer layer and then drying. In another method, a thermoplastic resin layer is formed on a temporary support, as needed, by applying thereto a solution of materials for forming the thermoplastic resin layer and then drying. An intermediate layer is further formed on the thermoplastic resin layer, as needed, by applying thereto a solution of materials for forming the intermediate layer using a solvent which does not dissolve the thermoplastic resin and then drying. A photopolymer layer is finally formed on the thermoplastic resin layer or the intermediate layer by applying a photopolymer solution using a solvent which does not dissolve the thermoplastic resin layer or the intermediate layer and then drying.

In yet another method, a photopolymer layer formed on a covering sheet is laminated with a sheet having a thermoplastic resin layer formed on a temporary support or with a sheet having the thermoplastic resin layer and an intermediate layer formed on the temporary support so as to bring the photopolymer layer into contact with the thermoplastic resin layer or the intermediate layer, respectively, to thereby prepare the photosensitive transfer material.

Furthermore, the photosensitive transfer material can be produced by forming a thermoplastic resin layer on a temporary support followed by laminating with a sheet having a photopolymer layer and an intermediate layer formed on a covering sheet so as to bring the thermoplastic resin layer into contact with the intermediate layer.

In some cases, after the photopolymer layer of a photosensitive transfer material is laminated with a permanent support, the laminate becomes electro-statically charged such that a person receives an unpleasant electrical shock on peeling the temporary support. Furthermore, this static build-up can cause the photopolymer layer to attract dust from the surroundings. This may leave unexposed portions in the photopolymer layer in the subsequent exposure step, to thereby generate pinholes. To prevent static buildup in the photosensitive transfer material of the present invention, the electrical surface resistivity is preferably adjusted to $10^{13}$ Ω/square or less by forming an electrically conductive layer on at least one side of the temporary support, or by imparting electrical conductivity to the temporary support itself.

Electrically conducting substances may be added to impart conductivity to the temporary support. For example, finely divided particles of a metal oxide or an antistatic agent may be incorporated into the temporary support. The finely divided particles of a metal oxide is at least one crystalline metal oxide selected from zinc oxide, titanium oxide, stannous oxide, aluminum oxide, indium oxide, silicon oxide, magnesium oxide, barium oxide, molybdenum oxide and/or composite oxides thereof. Examples of useful antistatic agents include anionic alkylphosphate type surfactants (for example, ELECTROSTRIPPER A manufactured by Kao Corporation, ELENON No 19 manufactured by Dai-ichi Kogyo Seiyaku Co., Ltd.), amphoteric betaine type surfactants (for example, AMORGEN K manufactured by Dai-ichi Kogyo Seiyaku Co., Ltd.), and nonionic polyoxyethylene fatty acid ester type surfactants (for example, NISSAN-NONION L manufactured by Nippon Oil and Fats Co., Ltd.) and polyoxyethylene alkyl ether type surfactants (for example, EMULGEN 106, 120, 147, 420, 220, 905, and 910 manufactured by Kao Corporation and NISSAN-NONION E manufactured by Nippon Oil and Fats Co., Ltd.). Besides these, nonionic surfactants such as polyoxyethylene alkylphenol ether type, polyhydric alcohol fatty acid ester type, polyoxyethylene sorbitan fatty acid ester type and polyoxyethylene alkylamine type surfactants can be employed.

The electrically conductive layer formed on the support is suitably selected from known electrically conductive layers. A preferred method is to incorporate finely divided particles of at least one crystalline metal oxide selected from ZnO, $TiO_2$, $SnO_2$, $Al_2O_3$, $In_2O_3$, $SiO_2$, MgO BaO, $MoO_3$ as electrically conducting substances and/or composite oxides thereof into the electrically conductive layer. This preferably imparts electrical conductivity which is not affected by humidity. The volume resistance of the finely divided particles of the crystalline metal oxides or composite oxides thereof is preferably $10^7$ Ω.cm or less, and more preferably $10^5$ Ω.cm or less. The particle size is preferably from 0.01 to 0.7 Bm, and more preferably from 0.02 to 0.5 μm.

Processes for preparing the finely divided particles of the conducting crystalline metal oxides and composite oxides thereof are described in detail in JP-A-56-143430. The processes are summarized as follows: First, the finely divided particles of metal oxide prepared by calcining are heat treated in the presence of a different kind of atom for improving conductivity; second, the calcination for preparing the finely divided particles of metal oxide is carried out in the presence of a different kind of atom for improving conductivity; and third, the finely divided particles of metal oxide are prepared by calcining in a low oxygen concentration atmosphere to introduce oxygen defects.

Examples of the different kinds of atoms include Al or In in ZnO, Nb or Ta in $TiO_2$, and Sb, Nb or halogens in $SnO_2$. The content of the different kinds of atoms preferably ranges from 0.01 to 30 mol %, and particularly preferably from 0.1 to 10 mol %.

The content of the electrically conducting particles is preferably from 0.05 to 20 $g/m^2$, and particularly preferably from 0.1 to 10 $g/m^2$.

Examples of binders for use in the electrically conductive layers of the present invention include gelatin, cellulose esters such as cellulose nitrate, cellulose triacetate, cellulose diacetate, cellulose acetate butyrate, and cellulose acetate propionate, homopolymers or copolymers containing vinylidene chloride, vinyl chloride, styrene, acrylonitrile, vinyl acetate, alkyl acrylate (the alkyl group having 1 to 4 carbon atoms), vinylpyrrolidone, etc., soluble polyesters, polycarbonate and soluble polyamide. Dispersion of electrically conducting particles into these binders may be carried out in the presence of dispersants such as titanium type or silane type dispersants. Furthermore, binder crosslinking agents may also be added.

Useful titanium type dispersants include the titanate type coupling agents described in U.S. Pat. Nos. 4,069,192 and 4,080,353 and PLENACT (trade name; manufactured by Ajinomoto Co., Inc.). Examples of useful silane type dispersants include vinyltrichlorosilane, vinyltriethoxysilane, vinyltris(β-methoxyethoxy)silane, γ-glycidoxypropyl-trimethoxysilane, and γ-methacryloxypropyltrimethoxysilane available from Shin-Etsu Chemical Co., Ltd. under the name "Silane Coupling Agents".

Examples of binder crosslinking agents include epoxy type, isocyanate type and aziridine type crosslinking agents.

Preferred electrically conductive layer for use in the present invention can be formed by applying finely divided conducting particles dispersed in a binder to a support, or by cladding the conducting particles onto an undercoat support.

When a conductive layer is formed on the side of a support opposite to the photopolymer layer, a hydrophobic polymer layer is further preferably formed on the conductive layer to provide good scratch resistance. To form the hydrophobic polymer layer, an organic solution or an aqueous latex may be used for coating. The coating weight after drying is preferably from about 0.05 to about 1 g/m².

Examples of useful hydrophobic polymers include cellulose esters such as nitrocellulose and cellulose acetate, vinyl type polymers of vinyl chloride, vinylidene chloride, vinyl acrylate, etc., and other polymers such as organic solvent-soluble polyamides and polyesters. To impart slip characteristics to the hydrophobic polymer layers, slip agents such as the organic carboxylic acid amides described in JP-A-55-79435 may be used, and matting agents may also be added. Forming such hydrophobic polymer layers does not substantially affect the electrical conductivity.

The undercoating layer may be formed using the vinylidene chloride type copolymers described in JP-A-51-135526 and U.S. Pat. Nos. 3,143,421, 3,586,508, 2,698,235, and 3,567,452, diolefin (like dibutadiene) type copolymers as described in JP-A-51-114120 and U.S. Pat. No. 3,615,556, glycidyl acrylate or glycidyl methacrylate type copolymers as described in JP-A-51-58469, polyamide-epichlorohydrin resins as described in JP-A-48-24923, and maleic anhydride type copolymers as described in JP-A-50-39536.

Furthermore, electrically conductive layer as disclosed in JP-A-56-82504, JP-A-56-143443, JP-A-57-104931, JP-A-57-118242, JP-A-58-62647, JP-A-60-258541, etc. can be suitably used in the present invention.

When the electrically conductive substance is incorporated into the same starting plastics as a temporary support film or into starting plastics different from the film, and the conductive layer is simultaneously extruded together with the support film, a conductive layer having excellent adhesion and scratch resistance can be easily prepared. This is a particularly preferred embodiment of the present invention, because it is then not necessary to form the above-described hydrophobic polymer layers or undercoating layers. The conductive layers may be coated using known methods such as roller coating, air-knife coating, gravure coating, bar coating and curtain coating.

To prevent electrostatic shock due to static build-up on using the image formation material of the invention, the surface resistivity of the conductive layer or the support (as treated or formed to impart electrical conductivity) is preferably $10^{13}$ Ω/square or less, and particularly preferably $10^{12}$ Ω/square or less.

To improve slip characteristics or to prevent undesirable adhesion of a photopolymer layer to the back side of a temporary support, known compositions for improving the slip characteristics containing finely divided particles or known compositions for surface lubricants containing silicone compounds are effectively applied to the back side of the temporary support.

When a conductive layer is formed on the side of the support opposite to the thermoplastic layer, the surface of the support may be treated for improving adhesion of the thermoplastic layer. Such treatments include surface treatments such as glow discharge, corona discharge, and ultraviolet light radiation treatments, and undercoating treatments with phenolic compounds, polyvinylidene chloride resins, styrene-butadiene rubber, or gelatin, and combinations of these treatments.

When an alkali-soluble thermoplastic resin is used for thermoplastic resin layer, a support made of polyethylene telephthalate film which has been subjected to corona discharge treatment followed by undercoating with gelatin is particularly preferred because they exhibit particularly excellent adhesive properties. The thickness of the gelatin layer is preferably from 0.01 to 2 μm.

The image formation method using the photosensitive transfer materials of the present invention is illustrated below. First, the covering sheet of the photosensitive transfer material is removed and the photopolymer layer is laminated with a substrate under pressure at an elevated temperature. The lamination can be conducted by using known laminators or vacuum laminators under application of heat (generally from 100° C. to 500° C.) and pressure (generally from 10 to 20 kg/cm²). An auto-cut laminator may also be used to improve productivity. The temporary support is then peeled. Next, the photopolymer layer is exposed through a predetermined mask (and through a thermoplastic resin layer and an intermediate layer which are formed as needed) and then developed. The development is conducted according to known methods which include immersion in a solvent or an aqueous developer, particularly in an alkaline solution, spraying with a developer, accompanied with rubbing with a brush, or applying supersonic waves. The developing period is generally from 5 to 60 seconds. A multicolor image can be formed by repeating this process several times by using photosensitive transfer materials containing a photopolymer layer having colors that are different from one another. The photosensitive transfer material of the present invention is particularly suitable for preparing color filters for liquid crystal displays.

The present invention is described in greater detail with reference to the following examples. However, the present invention is not to be construed as being limited to these Examples. All the parts, percents, ratios and the like are by weight unless otherwise indicated.

EXAMPLE 1

A coating solution prepared according to the following formulation H1 was applied to a temporary support made of polyethylene telephthalate film having a thickness of 100 μm. The coating solution was dried to form a thermo-plastic resin layer having a dried film thickness of 20 μm.

| Formulation H1 for Thermoplastic Resin Layer: | |
|---|---|
| Methyl Methacrylate/2-Ethylhexyl Acrylate/ Benzyl Methacrylate/Methacrylic Acid Copolymer [Composition (molar ratio): 55/28.8/11.7/4.5, Weight Average Molecular Weight: 90,000] | 15 parts |
| Polypropylene Glycol Diacrylate (Average Molecular Weight: 822) | 6.5 parts |
| Tetraethylene Glycol Dimethacrlate | 1.5 parts |
| p-Toluenesulfonamide | 0.5 part |
| Benzophenone | 1.0 part |
| Methyl Ethyl Ketone | 30 parts |

Then, a coating solution prepared according to the following formulation B1 was applied to the above-described thermoplastic resin layer and dried to form an intermediate layer having a dried film thickness of 1.6 μm.

| Formulation B1 for Intermediate Layer: | |
|---|---|
| Polyvinyl Alcohol (PVA205 manufactured by Kuraray Co., | 130 parts |

-continued

| Formulation B1 for Intermediate Layer: | |
|---|---|
| Ltd. Saponification Ratio: 80%) | |
| Polyvinylpyrrolidone | 60 parts |
| (PVP K-90 manufactured by GAF Corporation) | |
| Fluorine Type Surfactant | 10 parts |
| (SURFLON S-131 manufactured by Asahi Glass, Co., Ltd.) | |
| Distilled Water | 3350 parts |

Four photosensitive solutions prepared according to the four formulations shown in Table 1 and each having different color, namely, black (for B1 layer), red (for R layer), green (for G layer), and blue (for B layer), were respectively applied to the above-described four temporary supports having a thermoplastic resin layer and an intermediate layer. The coating solution were dried to form colored photopolymer layers each having a dried film thickness of 2 μm.

TABLE 1

Compositions of Coating Solutions for Colored Photopolymer Layers
(All parts are by weight in grams.)

| Components | Red (g) | Green (g) | Blue (g) | Black (g) |
|---|---|---|---|---|
| Benzyl Methacrylate/Methacrylic Acid Copolymer (Molar Ratio: 72/28, Molecular Weight: 30,000) | 30.0 | 33.5 | 34.1 | 40.6 |
| Pentaerythritol Hexaacrylate | 28.4 | 25.2 | 32.3 | 30.5 |
| F177P (Florine Type Surfactant Manufactured by Dainippon Ink and Chemicals, Inc.) | 0.37 | 0.19 | 0.19 | 0.30 |
| 2,4-Bis(trichloromethyl)-6-[4-(N,N-diethoxy-carbonylmethyl)-3-bromophenyl]-S-triazine | 1.31 | 0 | 1.52 | 1.47 |
| 2-trichloromethyl-5-(p-styrylstyryl)-1,3,4-oxadiazole | 0 | 1.2 | 0 | 0 |
| Phenothiazine | 0.022 | 0.020 | 0.026 | 0.015 |
| Chromophtal Red A2B | 27 | 0 | 0 | 0 |
| Quinophthalone dye (Yellow) Represented by Formula (3) below | 0.3 | 23.0 | 0 | 0 |
| Monastral Green 6Y | 0 | 23.0 | 0 | 0 |
| Heliogen Blue L6700F | 0 | 0 | 25.6 | 0 |
| Lionogen Violet RL | 0 | 0 | 0.8 | 0 |
| Carbon Black (Black) | — | — | — | 27.1 |
| Methoxypropylene Glycol Acetate | 310 | 310 | 310 | 310 |
| Methyl Ethyl Ketone | 460 | 460 | 460 | 460 |

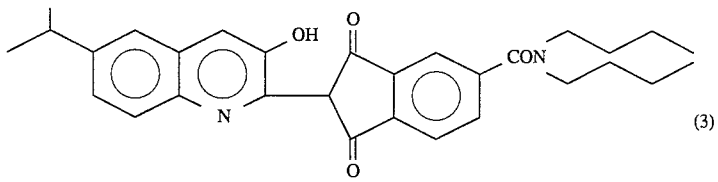

(3)

Furthermore, each of the above-described photopolymer layers was subjected to contact bonding with a covering sheet made of polypropylene (thickness: 12 μm) to form red, blue, green, and black photosensitive transfer materials, respectively.

A color filter was prepared from these photosensitive transfer materials according to the following method. The covering sheet of the red photosensitive transfer material was peeled, the photopolymer layer was laminated with a transparent glass substrate (thickness: 1.1 mm) using a laminator (VP-II manufactured by Taisei Laminator Co., Ltd.) under pressure (0.8 kg/cm$^2$) and at an elevated temperature (130° C.). Subsequently, the temporary support was peeled from the thermoplastic resin layer to remove the temporary support. Thereafter, the photopolymer layer was exposed through a predefined photomask, and the unexposed portions were removed by developing with an 1% aqueous solution of sodium carbonate to form a red picture element pattern on the glass substrate.

Subsequently, the green photosensitive transfer material was similarly laminated with the glass substrate on which the red picture element pattern had been formed, and peeling, exposure, and development were carried out to form a green picture element pattern.

Similarly, the blue and black photosensitive materials were treated to form a color filter on the transparent glass substrate. The color filter thus prepared had excellent resistance to heat and light, and also had high transmission and contrast. Furthermore, yellow dye did not ooze out such that the desired chromaticity was obtained.

COMPARATIVE EXAMPLE 1

A color filter was prepared in the same manner as in Example 1, except that the quinophthalone dye as a yellow colorant for adjusting the color tones of the red and green photosensitive transfer materials was replaced with the same grams of C. I. Pigment Yellow 139. The color filter thus prepared was inferior to that obtained in Example 1 in terms of transmission and contrast.

The contrast was measured in the following manner. A sample placed between two polarizing plates, and then, the amount of transmitted light were measured each when the axis of polarization was parallel or vertical. The ratio of these amounts is defined as "contrast" (The 7th Colorific Optics Conference, 1990, 512 Color Display 10.4 "Color Filters for Size TFT-LCD", by Ueki, Ozeki, Fukunaga, and Yamanaka).

Y values of the colors represented by XYZ type indication (JIS Z8701) are shown in Table 2 about the green picture elements of the color filters prepared in Example 1 and comparative Example 1, respectively. In Example 1, the Y value increased to thereby increase transmission. The contrast of the green picture elements similarly obtained is shown in Table 2. In Example 1, an increase in contrast was obtained.

TABLE 2

|  | Y Value | Contrast |
|---|---|---|
| Example 1 | 60 | 3420 |
| Comparative Example 1 | 45 | 1123 |

COMPARATIVE EXAMPLE 2

Four photosensitive solutions each having different color, namely, black (for Bl layer), red (for R layer), green (for G layer), and blue (for B layer) were prepared according to the formulations shown in Table 1, respectively. The red photosensitive solution was applied to a glass substrate and dried to form a red photopolymer layer having a dried film thickness of 2 μm. Exposure was then carried out through a predefined photomask, and the unexposed portions were removed by developing with an 1% aqueous solution of sodium carbonate to form a red picture element pattern on the glass substrate. Although the green photosensitive solution was subsequently applied to the glass substrate on which the red picture element pattern had been formed, the yellow dye oozed out of the red picture element. As a result the desired chromaticity was not obtained.

The photosensitive transfer materials of the present invention allow for the use of organic solvent-soluble dyes. Also, color filters having excellent resistance to heat and light together with high transmission and contrast can be prepared.

While the invention has been described in detail and with reference to specific examples thereof, it will be apparent to one skilled in the art that various changes and modifications can be made therein without departing from the spirit and scope thereof.

What is claimed is:

1. A photosensitive transfer material which comprises a temporary support and a colored photopolymer layer formed on said temporary support, wherein said colored photopolymer layer contains at least one quinophthalone dye selected from the group consisting of a compound represented by formula (1), a compound represented by formula (2) and tautomers thereof:

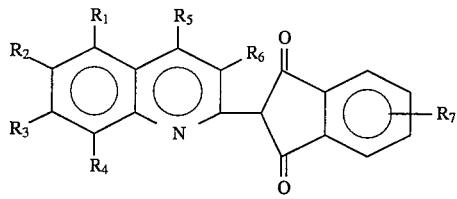

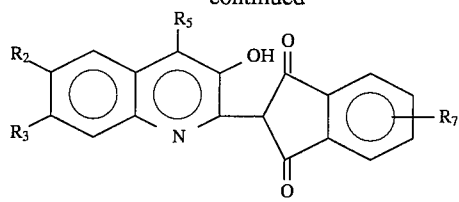

wherein $R_1$, $R_2$, $R_3$, $R_4$ and $R_5$ each represents a substituted or unsubstituted alkyl group having 1 to 20 carbon atoms, a cycloalkyl group, an aralkyl group, an aryl group, a halogen atom, or a hydrogen atom; $R_6$ represents a hydrogen atom or a hydroxyl group; and $R_7$ represents a hydrogen atom, a halogen atom, an alkoxy group, an amino group, an acyl group, an acylamino group, an alkoxycarbonyl group, a carbamoy, group, a substituted or unsubstituted alkyl group having 1 to 20 carbon atoms, a cycloalkyl group, an aralkyl group or an aryl group.

2. The photosensitive transfer material as claimed in claim 1, wherein said photosensitive transfer material further comprises a thermoplastic resin layer provided between said temporary support and said colored photopolymer layer.

3. The photosensitive transfer material as claimed in claim 1, wherein said colored photopolymer layer further contains a red pigment.

4. The photosensitive transfer material as claimed in claim 2, wherein said colored photopolymer layer further contains a red pigment.

5. The photosensitive transfer material as claimed in claim 1, wherein said colored photopolymer layer further contains a green pigment.

6. The photosensitive transfer material as claimed in claim 2, wherein said colored photopolymer layer further contains a green pigment.

7. The photosensitive transfer material as claimed in claim 1, wherein said alkyl group represented by $R_1$, $R_2$, $R_3$, $R_4$, and $R_5$ represents an unsubstituted alkyl group.

8. The photosensitive transfer material as claimed in claim 1, wherein said alkyl group represented by $R_7$ represents an unsubstituted alkyl group.

9. The photosensitive transfer material as claimed in claim 1, wherein said alkyl group represented by $R_1$, $R_2$, $R_3$, $R_4$, and $R_5$ is a substituted alkyl group selected from the group consisting of an alkoxyalkyl group, a halogenated alkyl group, an aminoalkyl group and an aminoalkoxyalkyl group.

10. The photosensitive transfer material as claimed in claim 1, wherein said alkyl group represented by $R_7$ is a substituted alkyl group selected from the group consisting of an alkoxyalkyl group, a halogenated alkyl group, an aminoalkyl group and an aminoalkoxyalkyl group.

11. The photosensitive transfer material as claimed in claim 1, wherein said colored photopolymer layer does not contain a yellow pigment or dye other than said at least one quinophthalone dye.

* * * * *